US010807864B2

(12) United States Patent
Brown et al.

(10) Patent No.: US 10,807,864 B2
(45) Date of Patent: Oct. 20, 2020

(54) METHODS OF ACHIEVING UNIVERSAL INTERFACING USING SUSPENDED AND/OR FREESTANDING STRUCTURES

(71) Applicant: THE REGENTS OF THE UNIVERSITY OF COLORADO, A BODY COPORATE, Denver, CO (US)

(72) Inventors: Joseph J. Brown, Boulder, CO (US); Victor M. Bright, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/882,302

(22) Filed: Jan. 29, 2018

(65) Prior Publication Data

US 2018/0215613 A1    Aug. 2, 2018

Related U.S. Application Data

(60) Provisional application No. 62/452,070, filed on Jan. 30, 2017.

(51) Int. Cl.
*B81C 3/00* (2006.01)
*H01L 23/00* (2006.01)
*B81B 7/00* (2006.01)
*B81C 1/00* (2006.01)
*H01L 25/065* (2006.01)

(52) U.S. Cl.
CPC ............ *B81C 3/001* (2013.01); *B81B 7/0006* (2013.01); *B81C 1/00095* (2013.01); *H01L 24/80* (2013.01); *H01L 25/0657* (2013.01); *B81C 2201/013* (2013.01); *B81C 2201/0108* (2013.01); *B81C 2201/0198* (2013.01); *B81C 2203/038* (2013.01); *B81C 2203/054* (2013.01); *H01L 2224/80898* (2013.01)

(58) Field of Classification Search
CPC ................ H01L 51/56; H01L 51/5012; H01L 51/5072; H01L 33/62; H01L 51/5253
USPC .......................................... 257/414
See application file for complete search history.

(56) References Cited

U.S. PATENT DOCUMENTS

| 5,806,152 A | 9/1998 | Saitou et al. |
| 6,392,144 B1 | 5/2002 | Filter et al. |
| 6,393,685 B1 | 5/2002 | Collins |
| 2004/0117955 A1* | 6/2004 | Barvosa-Carter ........................... A44B 18/0003 24/442 |
| 2004/0256226 A1* | 12/2004 | Wickersham, Jr. ......................... C23C 14/3407 204/298.01 |
| 2007/0084719 A1* | 4/2007 | Wickersham, Jr. ......................... C23C 14/3407 204/298.12 |

(Continued)

OTHER PUBLICATIONS

Aksak, et al.,Adhesion of Biologically Inspired Vertical and Angled Polymer Microfiber Arrays, Langmuir, vol. 23, No. 6 ,Feb. 7, 2007 ,pp. 3322-3332.

(Continued)

*Primary Examiner* — Andy Huynh
(74) *Attorney, Agent, or Firm* — Saul Ewing Arnstein & Lehr LLP; Kathryn Doyle; Domingos J. Silva

(57) ABSTRACT

The invention includes a method of promoting interfacial mechanical bonding of two or more components through the use of suspended and/or freestanding structures fabricated using an atom-scale assembly process on at least a portion of the surfaces of such components.

9 Claims, 15 Drawing Sheets

(56) References Cited

U.S. PATENT DOCUMENTS

2015/0318838 A1* 11/2015 Bhattacharjee .... H03H 9/02338
310/321

OTHER PUBLICATIONS

Berber, et al.,Bonding and Energy Dissipation in a Nanohook Assembly, Physical Review Letters, vol. 91, No. 16, Oct. 17, 2003 ,pp. 165503-1-165503-7.

Chalapat, et al.,Self-Organized Origami Structures via Ion-Induced Plastic Strain, Adv Mater, vol. 25 ,2013 ,pp. 91-95.

Chen, et al.,Mechanics of plant fruit hooks, Journal of the Royal Society Interface, 10:20120913 ,2013.

Cheng, et al.,Current Crowding Study of a Micro Spring Contact for Flip Chip Packaging, MEMS 2011, IEEE, Cancun, Mexico ,Jan. 23-27, 2011 ,pp. 360-363.

Davami, et al.,ALD Honeycomb Plates Enabling Robust Ultrathin MEMS, MEMS 2014, IEEE, San Francisco, CA ,Jan. 26-30, 2014 ,pp. 449-452.

Davami, et al.,Ultralight shape-recovering plate mechanical metamaterials, Nature Communications, DOI: 10:1038 , Dec. 3, 2015 ,pp. 1-7.

Eigenfeld, et al.,Ultra-thin 3D Nano-Devices from Atomic Layer Deposition on Polyimide, Adv Mater, vol. 26 ,2014 ,pp. 3962-3967.

Genc, et al.,A Hierarchical Classification Scheme to Define and Order the Design Space for Integral Snap-Fit Assembly, Research in Engineering Design, vol. 10 ,1998 ,pp. 94-106.

Gillies, et al.,A micromolded connector for reconfigurable millirobots, J Micromech Microeng, vol. 20 ,2010 ,pp. 1-11.

Gorb, et al.,Probabilistic fasteners with parabolic elements: biological system, artificial model and theoretical considerations, Philosophical Transactions of the Royal Society, Lond A, 360 ,Feb. 15, 2002 ,pp. 211-225.

Han, et al.,Mating and Piercing Micromechanical Structures for Surface Bonding Applications, Proceedings. IEEE Micro Electro Mechanical Systems, Conference Nara, Japan ,Jan. 1991 ,pp. 253-258.

Han, et al.,Micromechanical Velcro, Journal of Microelectromechanical Systems, vol. 1, No. 1 ,Mar. 1992 ,pp. 37-43.

Jonnalagadda, et al.,Nanoneedles based on porous silicon for chip bonding with self assembly capability, Phys Status Solidi C 8, No. 6 ,2011 ,pp. 1841-1846.

Jorabchi, et al.,Nonlinear Algebraic Reduction for Snap-Fit Simulation, J Mech Des, vol. 131 ,Jun. 2009 ,pp. 061004-1-061004-8.

Keshavarzi, et al.,Room Temperature Si—Si Direct Bonding Technique Using Velcro-Like Surfaces, Journal of Microelectromechanical Systems, vol. 25, No. 2 ,Apr. 2016 ,pp. 371-379.

Klahn, et al.,Design Guidelines for Additive Manufactured Snap-Fit Joints, Procedia CIRP 50, 26th CIRP Design Conference ,2016 ,pp. 264-269.

Kovalev, et al.,Unzipping bird feathers, Journal of the Royal Society Interface, vol. 11: 20130988 ,2013 ,pp. 1-8.

Lee, et al.,Micro-Brush Press-On Contact: A New Technique for Room Temperature Electrical and Mechanical Attachment, MEMS 2006, Istanbul, Turkey ,Jan. 22-26, 2006 ,pp. 342-345.

Li, et al.,Design of Heat-Activated Reversible Integral Attachments for Product-Embedded Disassembly, IEEE Conference, Tokyo, Japan ,Dec. 11-15, 2001 ,pp. 360-365.

Messler, Jr., et al.,Integral attachment using snap-fit features: a key to assembly automation. Part 1—introduction to integral attachment using snap-fit features, Assembly Automation, vol. 17, No. 7 , 1997 ,pp. 143-155.

Messler, Jr., et al.,Integral attachment using snap-fit features: a key to assembly automation. Part 3—an attachment-level design methodology, Assembly Automation, vol. 17, No. 3 ,1997 ,pp. 239-248.

Messler, Jr., et al.,Integral Micro-Mechanical Interlock (IMMI) Joints for Polymer-Matrix Composite Structures, Journal of Thermoplastic Composite Materials, vol. 11 ,May 1998 ,pp. 200-215.

Miller, et al.,Micromachined, flip-chip assembled, actuatable contacts for use in high density interconnectino in electronics packaging, Sensors and Actuators A, vol. 89 ,2001 ,pp. 76-87.

Ogawa, et al.,Mushroom plasmonic metamaterial infrared absorbers, Applied Physics Letters, vol. 106 ,2015 ,pp. 041105-1-041105-4.

Peng, et al.,Increased Interfacial Strength at Microscale Silicon-Polymer Interface by Nanowires Assisted Micro-Sandglass Shaped Interlocks, Japanese Journal of Applied Physics, vol. 51 ,2012 ,pp. 027302-1-027302-8.

Pugno, et al.,Velcro(R) nonlinear mechanics, Applied Physics Letters, vol. 90 ,2007 ,pp. 121918-1-121918-2.

Reed, et al.,Silicon Micro-Velcro, Adv Mater, vol. 4, No. 1 ,Jan. 1, 1992 ,pp. 48-51.

Shalaby, et al.,Design for Disassembly With High-Stiffness Heat-Reversible Locator-Snap Systems, Journal of Mechanical Design, vol. 130 ,Dec. 2008 ,pp. 121701-1-121701-7.

Shubin, et al.,A Package Demonstration with Solder Free Compliant Flexible Interconnects, 2010 Electronic Components and Technology Conference ,2010 ,pp. 1429-1435.

Suri, et al.,Structural Abstraction in Snap-fit Analysis, Journal of Mechanical Design, vol. 22 ,Dec. 2000 ,pp. 395-402.

Szyndler, et al.,Entrapment of bed bugs by leaf trichomes inspires microfabricationof biomimetic surfaces, Journal of the Royal Society Interface 10: 20130174 ,2013 ,pp. 1-9.

Tawfick, et al.,Engineering of Micro- and Nanostructured Surfaces with Anisotropic Geometries and Properties, Adv Mater, vol. 24 ,2012 ,pp. 1628-1674.

Vokoun, et al.,Fastening of shape memory hook arrays, ESOMAT 2009, DOI: 10.1051/esomat/200907017 ,2009 ,pp. 1-6.

Vokoun, et al.,Velcro-like fasteners based on NiTi micro-hook arrays, Smart Mater Struc, vol. 20 ,2011 ,pp. 1-13.

Williams, et al.,The peeling of flexible probabilistic fasteners, Tribology Letters, vol. 26, No. 3 ,Jun. 2007 ,pp. 213-222.

* cited by examiner

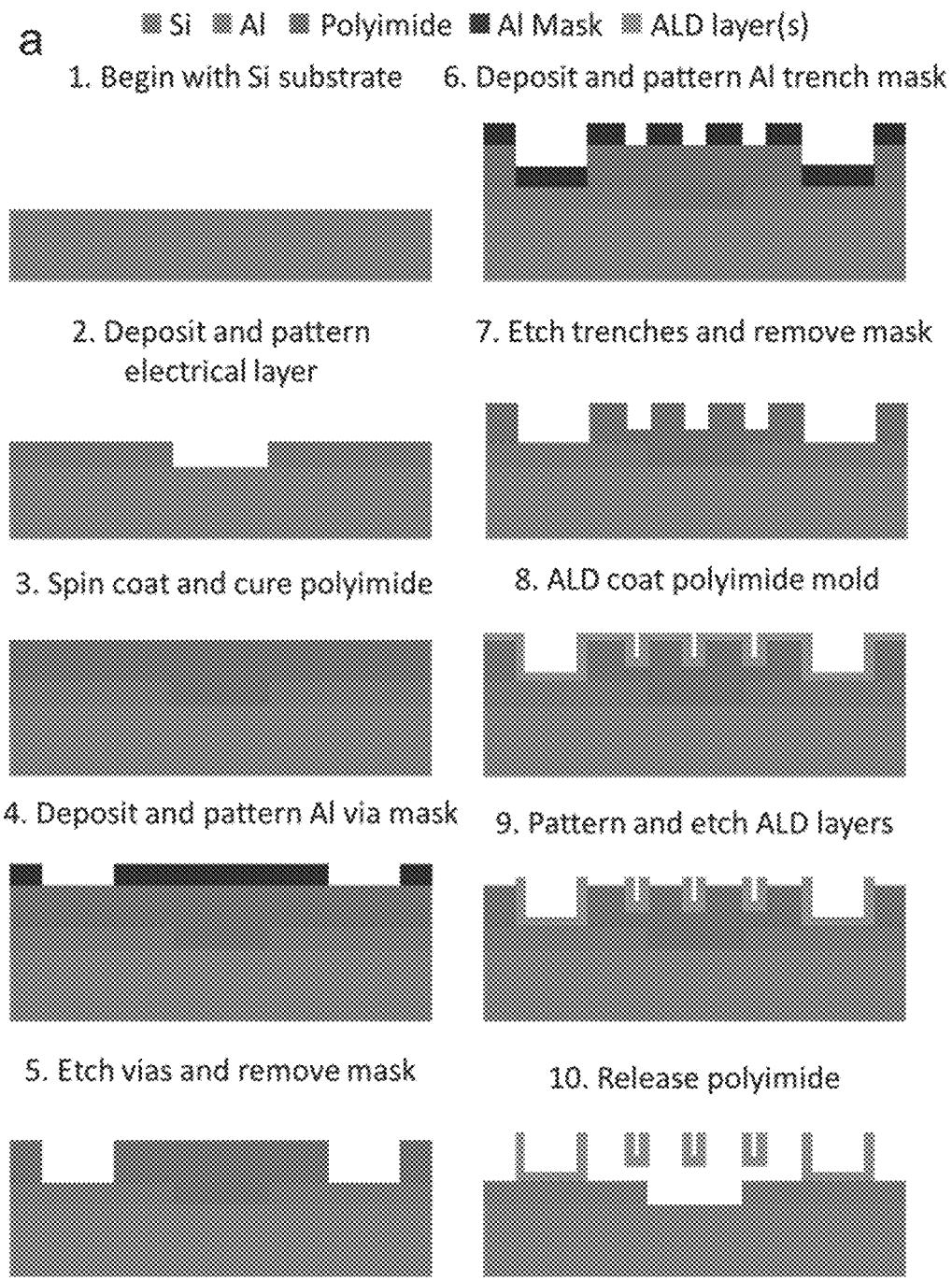

a b

METHODS OF ACHIEVING UNIVERSAL INTERFACING USING SUSPENDED AND/OR FREESTANDING STRUCTURES

CROSS-REFERENCE TO RELATED APPLICATIONS

The present application claims priority under 35 U.S.C. § 119(e) to U.S. Provisional Patent Application No. 62/452,070, filed Jan. 30, 2017, which is incorporated herein by reference in its entirety.

BACKGROUND OF THE INVENTION

There has been great interest in developing systems that allow for efficient interfacing of derivatized surfaces. Typical approaches have included silicon-based microvelcro, nanowire forests, carbon nanotube forests, and biomimetic polymer pillar arrays. However, challenges remain. Microfabricated interlocking pillars have not found wide use in the field. Microfabricated sliding channel-lock interfaces are more complex to assemble than parts that mesh from normal attachment of surfaces. Microfabricated silicon velcro structures are limited in robustness and durability. Furthermore, these earlier microvelcro systems targeted biological applications and did not provide a compelling advantage over other microscale adhesion systems.

Certain approaches to surface bonding are centered on microscale and nanoscale interfacing parts, but do not afford permanent bonding. They are thus inappropriate for electronics packaging applications. Microfiber, nanowire, and nanotube interfacing approaches focus on large surface area van der Waals interactions, and sometimes have large regions of failure.

The miniaturization of electronic components and systems is a decades-long trend, and miniaturization of packaging, assembly, and interconnection technologies has been part of this trend. Unfortunately, reliability problems have increased as technology has moved to lead-free solder and copper pillar interconnect technologies. Other challenges facing electronics interconnect technologies center on power dissipation, in which interconnects create a performance bottleneck due to energy dissipation, potentially consuming up to 80% of processor power. To address these challenges, the reliability of interconnects should increase; further, the research community is moving flipchip solder bump pitch to 110 µm, and wirebond pitch to 35 µm (and likely to 25 µm or smaller). The research community has begun exploring "ultrafine pitch" packaging interconnects, defined in the range of 6 µm-60 µm. These technologies typically require thermal processing at 180° C.–300° C. Some alternative methods have been proposed, including conductive adhesives, compliant spring contacts, and carbon nanotube based interconnects, but none has yet developed into a viable system. Further, conductive adhesives may not match the performance of current technology. Compliant spring contacts do not lock in place permanently, require special processing, and have been demonstrated only at 180 µm pitch. CNT-based interconnects require high-temperature (>300° C.) processing for CNT synthesis or ohmic connections. Reliability and density of chip-scale optical and wireless interconnects have thus far been a problem.

Atomic layer deposition (ALD) deposits materials conformally based on the automated cycling of component gases. The growth of individual layers is a self-limiting reaction, resulting in linear growth of material, dependent upon the number of cycles to which a substrate is exposed. Molecular layer deposition (MLD) uses a similar approach to generate controlled-thickness conformal polymer layers. MLD layers are formed from a wide variety of reactive organic groups, and can be deposited in combination with inorganic ALD layers. Both ALD and MLD allow thickness control and conformality unmatched by any other available industrial process. Moreover, the ALD and MLD processes are low temperature, with typical deposition temperatures below 200° C. ALD materials currently available include ceramics ($Al_2O_3$, TaN, $SiO_2$, $HfO_2$, MgO, MnO), metals (W, Pt, Ru), semiconductors (ZnO, AN), and various other inorganic materials.

There is a need in the art for novel methods of effecting interfacing among components. Such methods should allow for the mechanical and/or electrical interfacing among the components. The present invention meets this need.

BRIEF SUMMARY OF THE INVENTION

The invention provides a method of promoting interfacing between two or more components. The invention further provides interlocked components prepared according to the method of the invention. The invention further provides a component prepared according to the method of the invention.

In certain embodiments, the method comprises contacting the two or more components. In other embodiments, at least a portion of the contacted surfaces of the two or more components independently comprise suspended and/or freestanding structures. In yet other embodiments, the pattern width or device pitch of the suspended and/or freestanding structures is equal to or lower than about 1 mm. In yet other embodiments, interlocking of structures of the two or more components takes place.

In certain embodiments, the suspended and/or freestanding structures in the two or more components are the same. In other embodiments, the suspended and/or freestanding structures in the two or more components are not the same. In yet other embodiments, the suspended and/or freestanding structures in the two or more components are complementary to each other.

In certain embodiments, the average pattern width or device pitch of the suspended and/or freestanding structures is equal to or less than about 200 µm. In other embodiments, the average pattern width and/or device pitch of the suspended and/or freestanding structures is selected from the group consisting of equal to or less than about 50 µm, equal to or less than 20 µm, equal to or less than about 10 µm, equal to or less than about 1 µm, equal to or less than 100 nm, equal to or less than 50 nm, equal to or less than 20 nm, and equal to or less than about 5 nm. In yet other embodiments, the average thickness of the suspended and/or freestanding structures ranges from about 1 to about 1,000 atoms. In yet other embodiments, the average thickness of the suspended and/or freestanding structures is equal to or less than about 100 nm. In yet other embodiments, the average thickness of the suspended and/or freestanding structures is equal to or less than about 20 nm.

In certain embodiments, the interlocking of the two or more components creates an electrical connection among the components. In other embodiments, the interlocking of the two or more components creates a thermal connection among the components. In yet other embodiments, an electrical contact exists between the suspended and/or freestanding structures and the corresponding supporting layer in at least one of the components.

In certain embodiments, the suspended and/or freestanding structures are prepared using a method comprising surface micromachining, lithography and/or atomic layer deposition (ALD). In other embodiments, the interlocked two or more components are further subjected to ALD of an insulating ceramic. In yet other embodiments, the insulating ceramic includes at least one selected from the group consisting of $Al_2O_3$, $TiO_2$, $SiO_2$, and $HfO_2$.

In certain embodiments, the interlocked two or more components are further subjected to atomic layer deposition of a conducting or semiconducting material. In other embodiments, the conducting or semiconducting material includes at least one selected from the group consisting of tungsten, ruthenium, platinum, molybdenum, titanium nitride, zinc oxide, and tin oxide.

In certain embodiments, at least one of the components is rigid, flexible or malleable. In other embodiments, at least one of the components is optically transparent. In yet other embodiments, at least one of the components is optically translucent. In yet other embodiments, at least one of the components is electrically conductive. In yet other embodiments, the electrical conductivity of at least one component is greater than $10^5$ sieverts per meter.

In certain embodiments, at least a portion of the surface of the component comprise suspended and/or freestanding structures. In other embodiments, the pattern width or device pitch of the suspended and/or freestanding structures is equal to or lower than about 1 mm. In yet other embodiments, the suspended structures are prepared using a method comprising surface micromachining, lithography and/or ALD.

In certain embodiments, the structures are supported on a sacrificial material layer. In other embodiments, the structures are anchored to a substrate immobilized on the component. In yet other embodiments, ALD is used to deposit a conductive layer on the suspended and/or freestanding structures. In yet other embodiments, the conductive layer comprises tungsten or ruthenium. In yet other embodiments, the conductive layer is coated with an insulating layer. In yet other embodiments, the insulating layer comprises $Al_2O_3$ or $TiO_2$. In yet other embodiments, the sacrificial material layer comprises a polymer, a metal, a semiconductor, or a ceramic. In yet other embodiments, the sacrificial material layer comprises at least one selected from the group consisting of polyimide, cellulose, epoxy, SU-8 epoxy, nickel, copper, silver, tin, silicon, and silicon oxide, and any alloy thereof. In yet other embodiments, the sacrificial material layer comprises a polymer generated using molecular layer deposition, wherein the polymer optionally comprises poly(aluminum alkoxide).

In certain embodiments, the suspended structures comprises a 2D nanomaterial. In other embodiments, the 2D nanomaterial comprises graphene, tungsten disulfide, molybdenum disulfide, or boron nitride.

In certain embodiments, the average pattern width or device pitch of the suspended and/or freestanding structures is equal to or less than about 200 µm. In other embodiments, the average pattern width or device pitch of the suspended and/or freestanding structures is selected from the group consisting of equal to or less than about 50 µm, equal to or less than about 20 µm, equal to or less than about 10 µm, equal to or less than about 1 µm, equal to or less than 100 nm, equal to or less than 50 nm, equal to or less than 20 nm, and equal to or less than 5 nm. In yet other embodiments, the average thickness of the suspended and/or freestanding structures ranges from about 1 to about 1,000 atoms. In yet other embodiments, the average thickness of the suspended and/or freestanding structures is equal to or less than about 100 nm. In yet other embodiments, the average thickness of the suspended and/or freestanding structures is equal to or less than about 20 nm.

In certain embodiments, the component is rigid, flexible or malleable. In other embodiments, the component is optically transparent. In yet other embodiments, the component is optically translucent.

In certain embodiments, an electrical contact exists between the suspended and/or freestanding structures and the corresponding supporting layer in the component. In other embodiments, the conductive layer comprises platinum, molybdenum, titanium nitride, zinc oxide, tin oxide, or any other conducting or semiconducting material generated from atomic layer deposition. In yet other embodiments, the insulating layer comprises $SiO_2$, $HfO_2$, or any other insulating material generated from atomic layer deposition.

In certain embodiments, the surface micromachining method includes evaporation, sputtering, or chemical vapor deposition of a material. In other embodiments, the material includes at least one selected from the group consisting of gold, nickel, titanium, carbon, nickel, chromium, boron nitride, aluminum, copper, silicon, and germanium.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

FIGS. 1A-1B are a lithographic layout and a solid model, respectively, of a suspended frame to be fabricated on one surface. FIGS. 1C-1D are a lithographic layout and a solid model, respectively, of an interfacing tab to be fabricated on a second surface. FIG. 1E illustrates the mechanical interface of the two parts; in this view the interfacing tab has been pressed through the frame from the top.

FIGS. 2A-2B illustrate surfaces successfully bonded together using this fabricated pattern. These images show the bonded chips held by tweezers and viewed from the front and back of each chip. For scale, the glass slide in the background was about 25 mm wide, and the chips were 15 mm on each of the diced edges. FIG. 2C is a scanning electron microscope (SEM) image of the bonding pattern, showing suspended regions surrounding a central support pillar. FIG. 2D illustrates an optical microscope image of an array of the meshing pattern. FIG. 2E illustrates a tilted SEM view of the meshing devices, showing protrusion of the suspended film beyond the central polymer pillar that bonds it to the substrate. The suspended film was approximately 20 nm in thickness.

FIGS. 3A-3B illustrate front and back views of two surfaces that were successfully bonded together with this fabricated pattern. For scale, the chips were 15 mm on each of the diced edges. FIG. 3C illustrates a SEM top view image of the bonding pattern, showing suspended regions surrounding a central support pillar. FIG. 3D illustrates a tilted SEM view of the meshing devices, showing protrusion of the suspended ~20 nm film beyond the central polymer pillar that bonds it to the substrate. FIG. 3E illustrates an optical microscope image of an array of the meshing pattern.

FIGS. 4A-4E illustrate a non-limiting fabrication processing overview. FIG. 4A illustrates fabrication process steps 1-10 with descriptions. The process may be extended to multiple levels by repeating steps 3-9 before finishing with release step 10. FIG. 4B illustrates etched polyimide mold of vias and trenches with aluminum mask. The via was nominally 3 μm deep and open to the underlying metal layer and connected to a 1.5 μm deep trench pattern. FIG. 4C illustrates partially released structures consisting of 2.2 nm $Al_2O_3$/18 nm W/2.2 nm $Al_2O_3$. The ALD layers coat the via and trench mold from FIG. 4B. FIG. 4D illustrates a magnified view of a portion of the structures in FIG. 4C. FIG. 4E illustrates TEM cross-sectional image of an $Al_2O_3$/W/$Al_2O_3$ coating on polyimide with similar thicknesses to FIG. 4C and FIG. 4D. All images in FIGS. 4C-4D were taken with an SEM at a 75° stage tilt angle.

FIG. 5A illustrates two-story suspended fixed-fixed cantilever structures comprised of 5.5 nm $Al_2O_3$/2.5 nm Ru/5.5 nm $Al_2O_3$ fabricated from the extended process outlined in FIG. 4A. The second level vias are etched to the underlying first level patterned nanostructures and the deposition and patterning repeated. A short lithography step at step 5 of the extended process of FIG. 2A was incorporated to fill the vias and protect the first level ALD from being etched during the Al mask removal. FIG. 5B illustrates an array of spring-like structures comprised of 5.5 nm $Al_2O_3$/18 nm W/5.5 nm $Al_2O_3$. These structures were spaced at a pitch of 32.5 μm. FIG. 5C illustrates curled structures comprised of 5.5 nm $Al_2O_3$/5 nm Ru/7.7 nm $Al_2O_3$. FIG. 5D illustrates a microbolometer-like structure with trench, comprised of 5.5 nm $Al_2O_3$/5 nm Ru/7.7 nm $Al_2O_3$. FIG. 5E illustrates a curled structure comprised of 5.5 nm $Al_2O_3$/5 nm Ru/7.7 nm $Al_2O_3$. FIG. 5F illustrates a micromechanical paddle structure comprised of 2.2 nm $Al_2O_3$/18 nm W/2.2 nm $Al_2O_3$. FIGS. 5A and 5D were taken at a 60° stage tilt angle, and FIGS. 5B, 5D, 5E and 5F at a 45° stage tilt angle.

In FIG. 6A, nominal top and bottom $Al_2O_3$ thicknesses resulted in upward curl, while in FIG. 6B a top $Al_2O_3$ layer two times thicker resulted in downward curl. In FIG. 6C, a flat structure was achieved with a 1.4 times nominal top $Al_2O_3$ layer and nominal bottom $Al_2O_3$ layer. SEM images were taken at 45° stage tilt angle.

DETAILED DESCRIPTION OF THE INVENTION

Figure 1A:
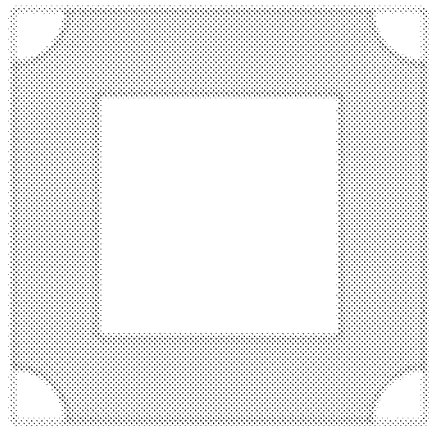
FIGS. 1A-1E are non-limiting illustrations of suspended structures for mechanical interfacing.
Figure 1B:
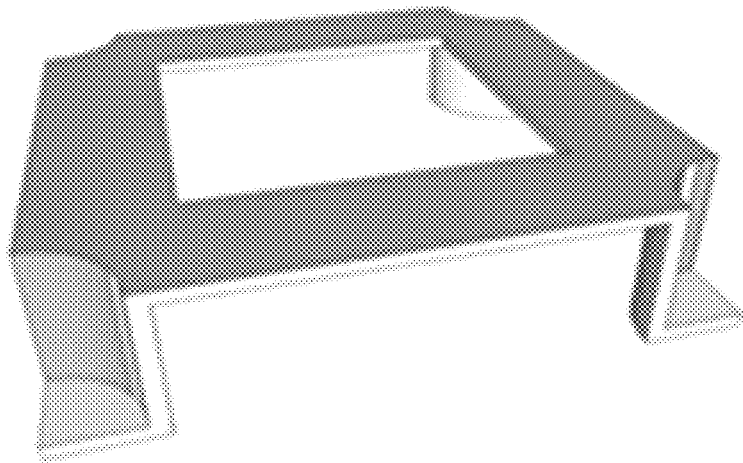
Figure 1C:
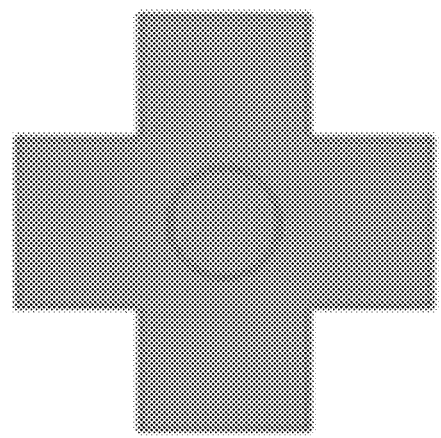
Figure 1D:
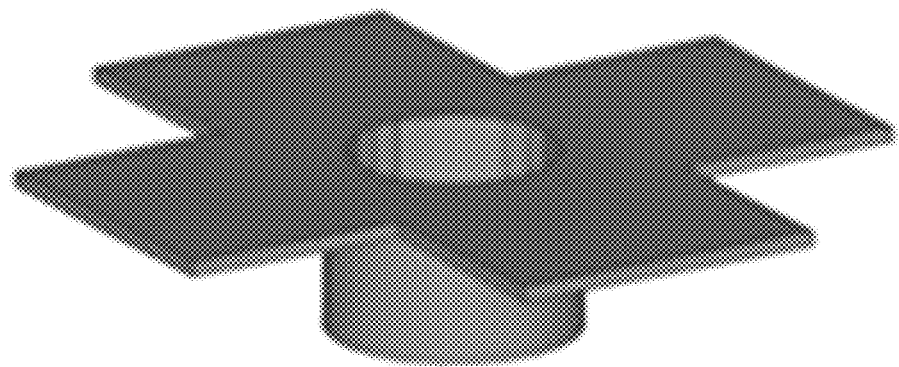
Figure 1E:
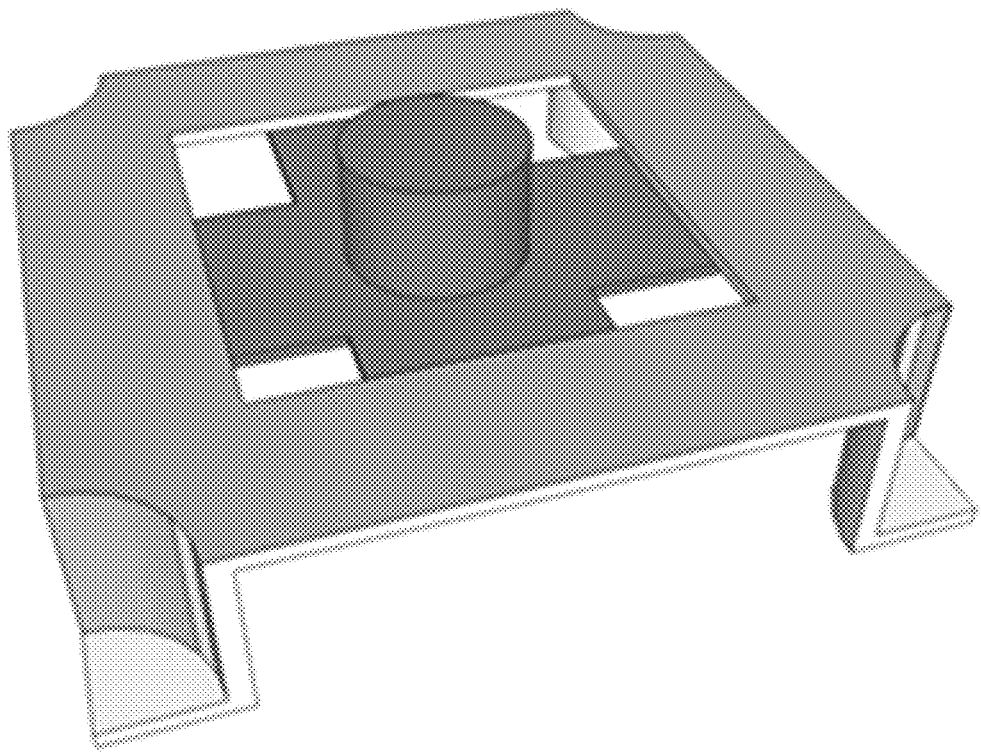
Figure 2A:
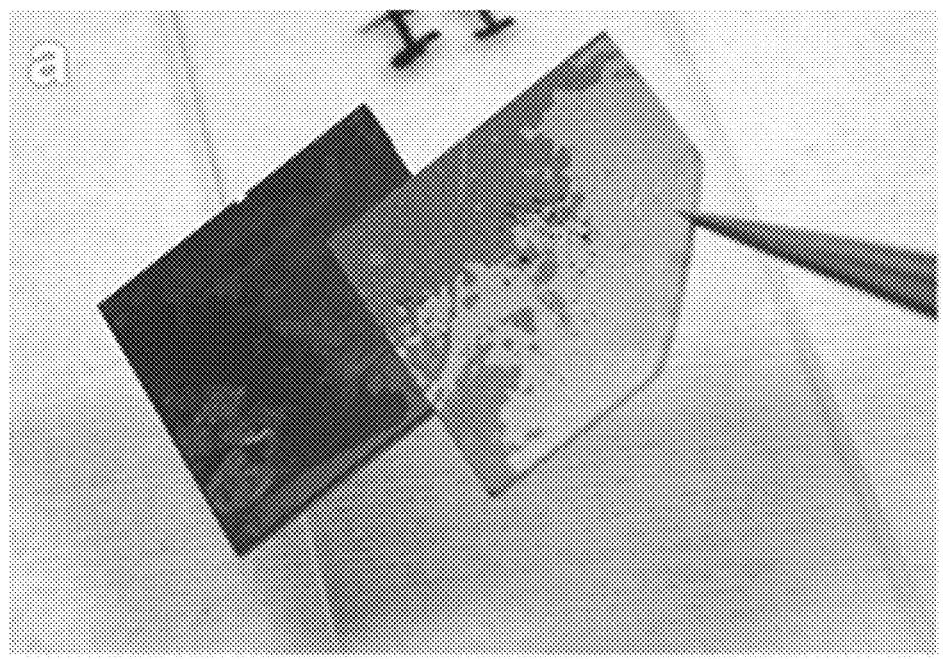
FIGS. 2A-2E are non-limiting illustrations of meshing surface arrays using "square" pattern.
Figure 2B:
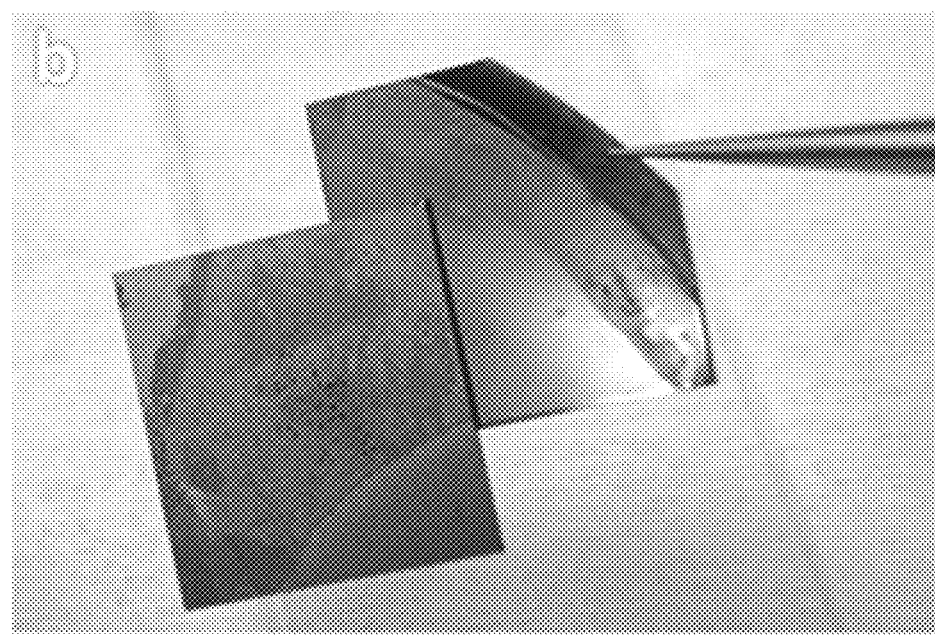
Figure 2C:
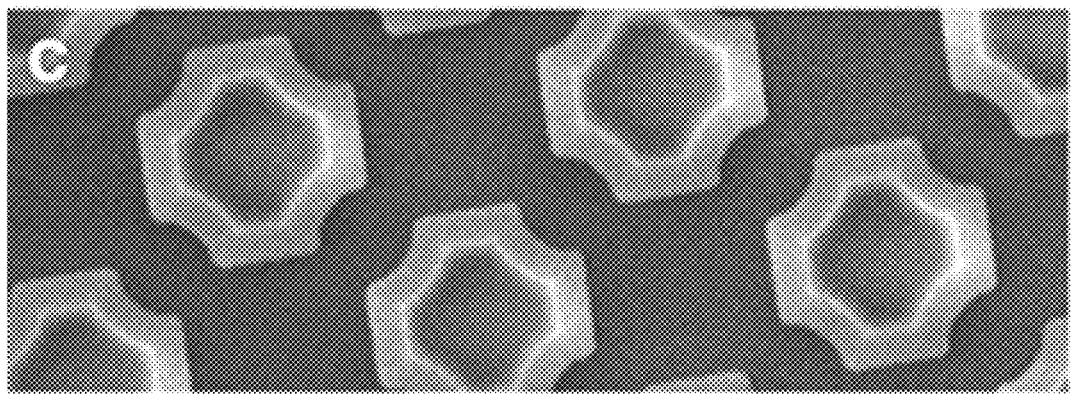
Figure 2D:
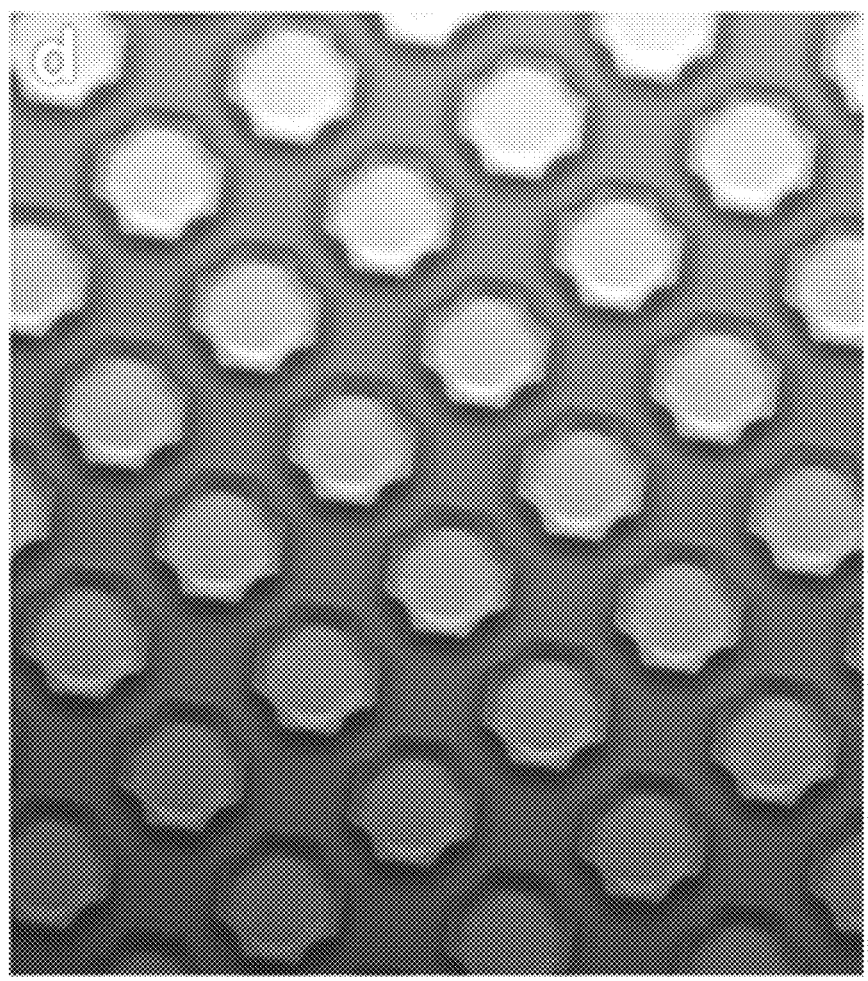
Figure 2E:
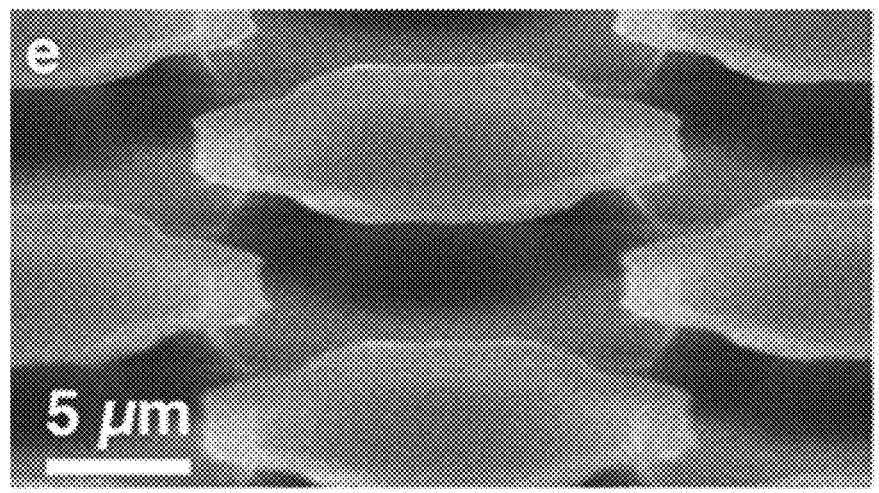
Figure 3A:
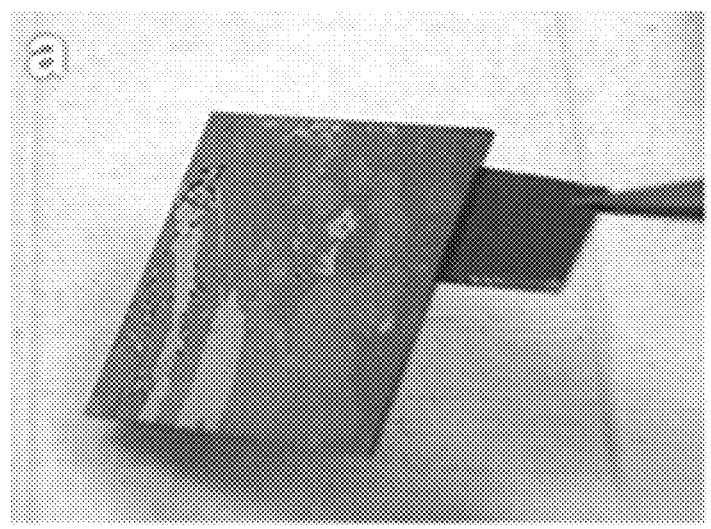
FIGS. 3A-3E illustrate a meshing surface array using triangular pattern.
Figure 3B:
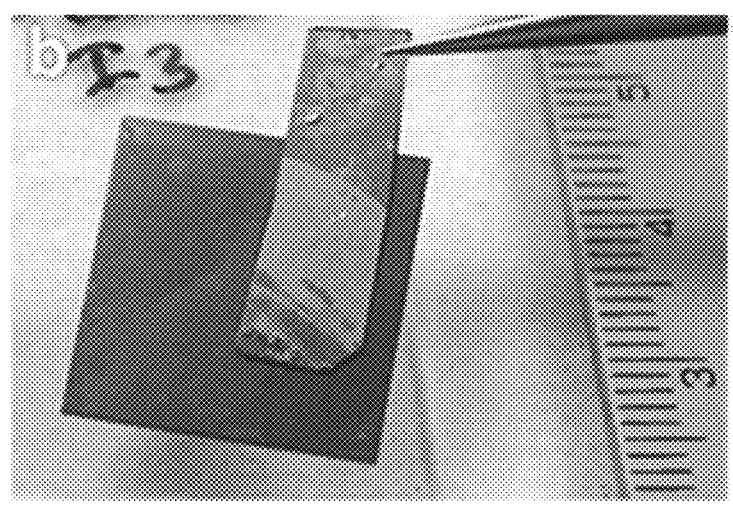
Figure 3C:
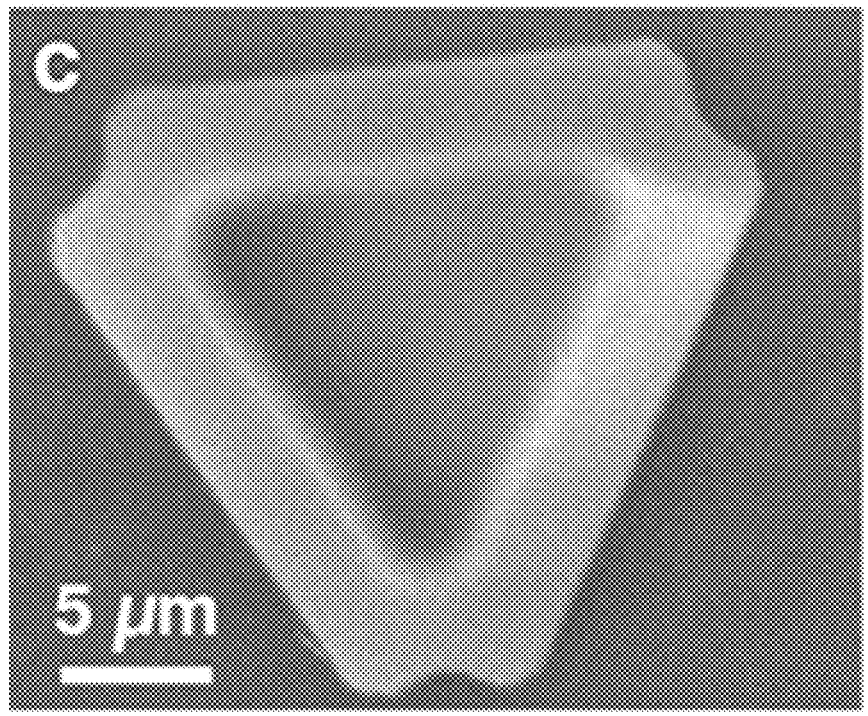
Figure 3D:
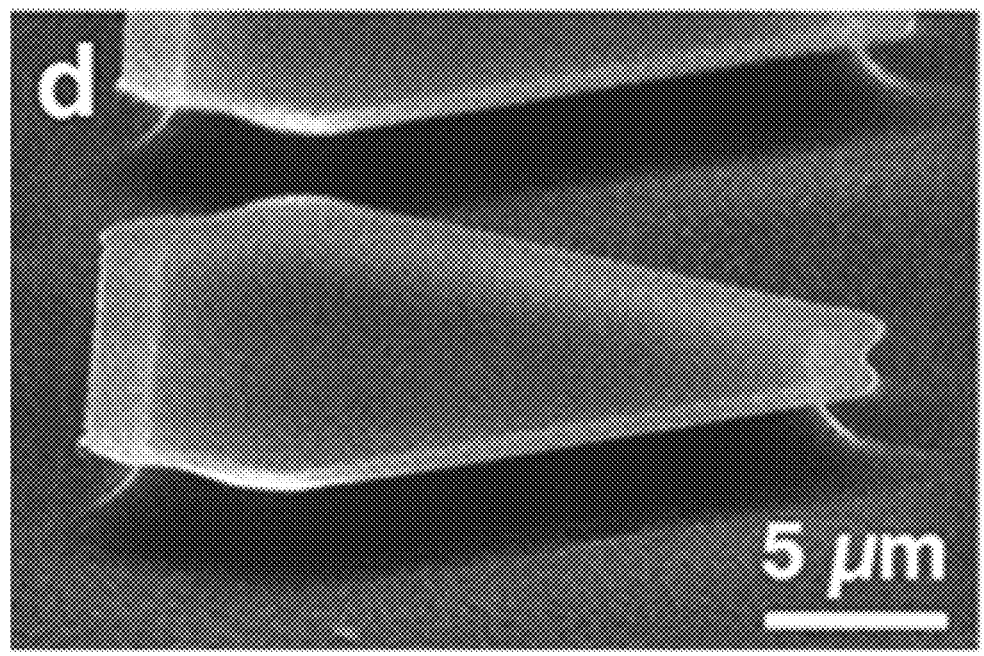
Figure 3E:
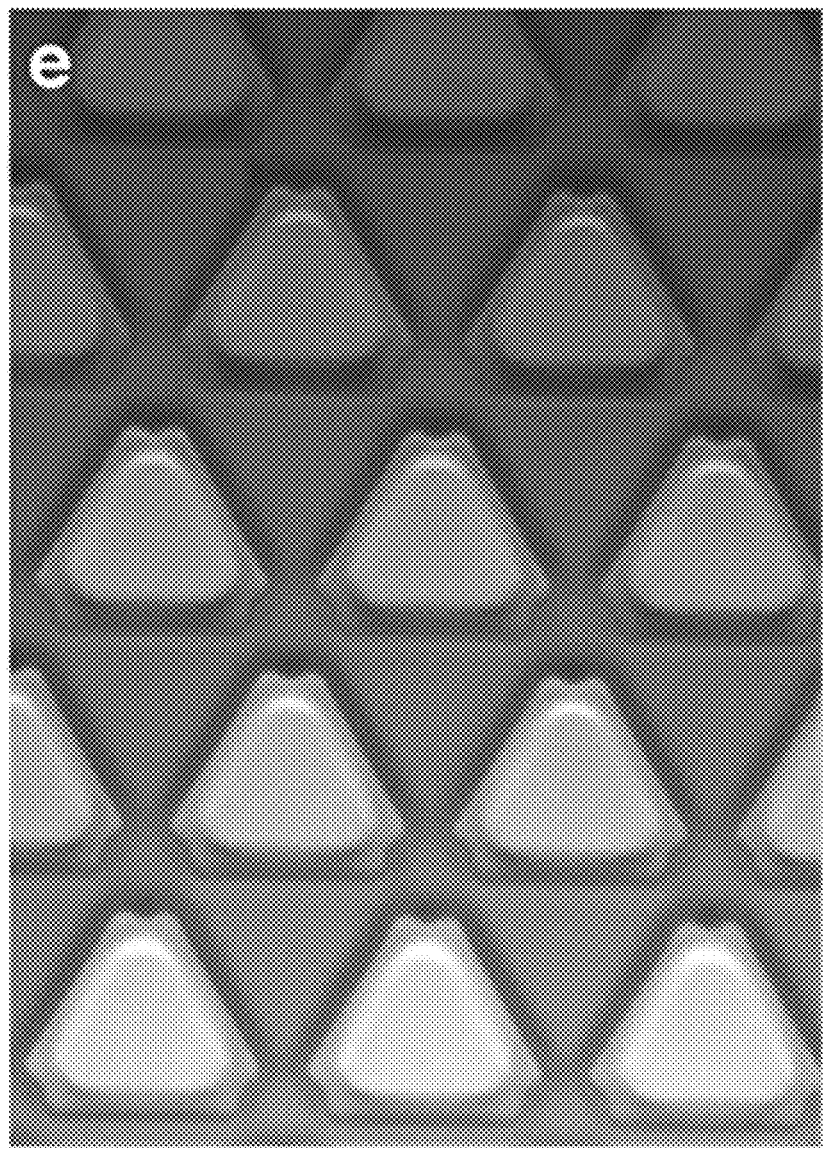
Figure 4B:
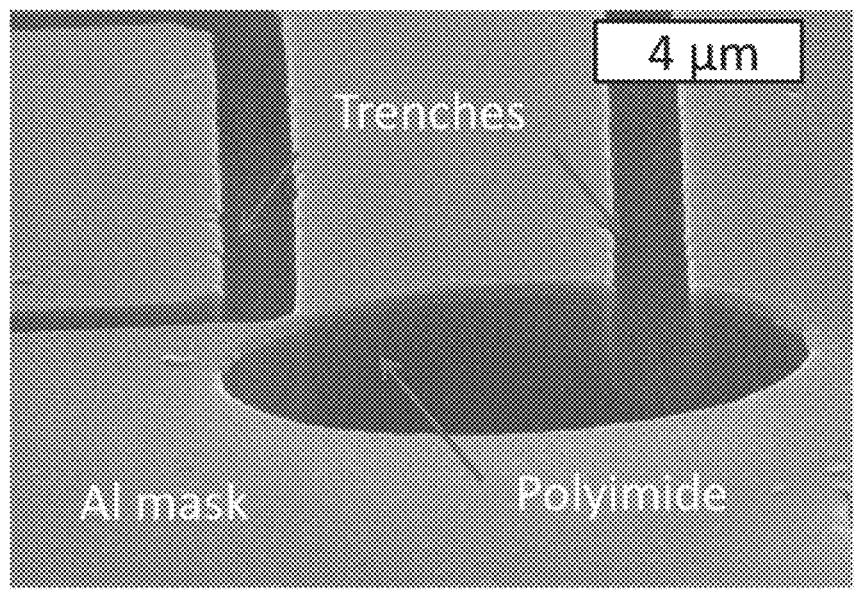
Figure 4C:
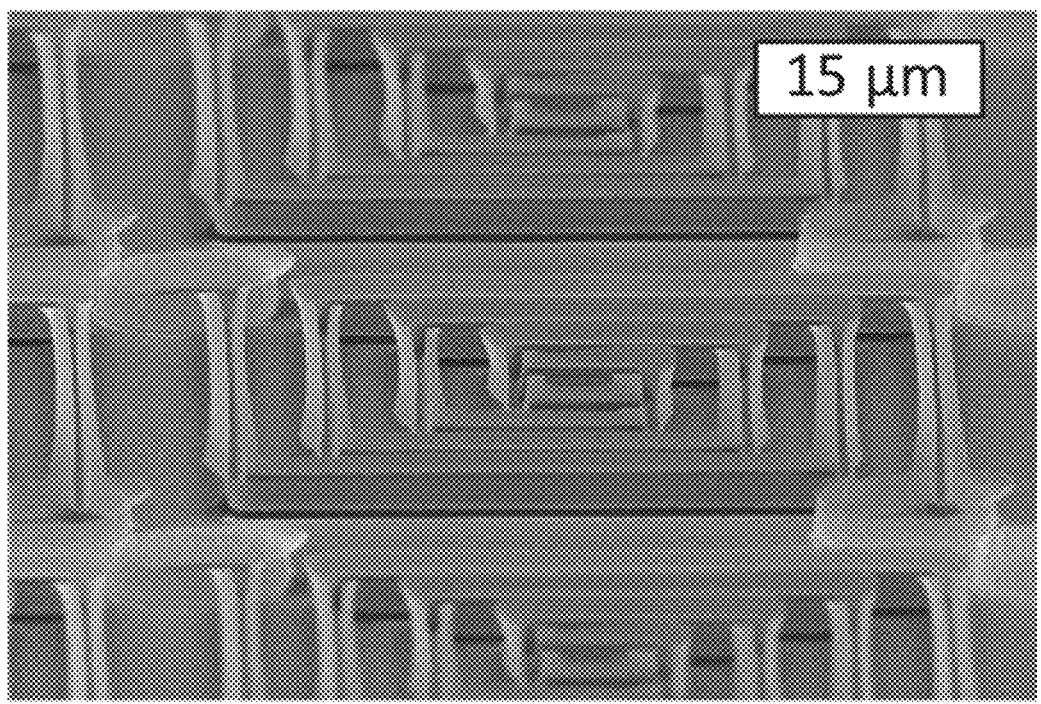
Figure 4D:
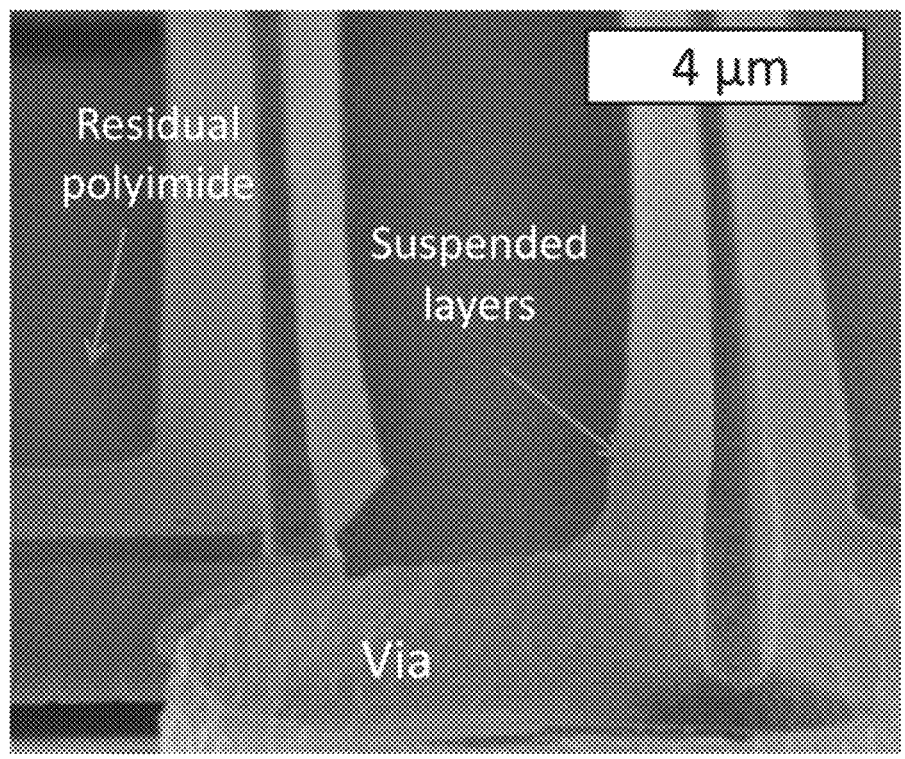
Figure 4E:
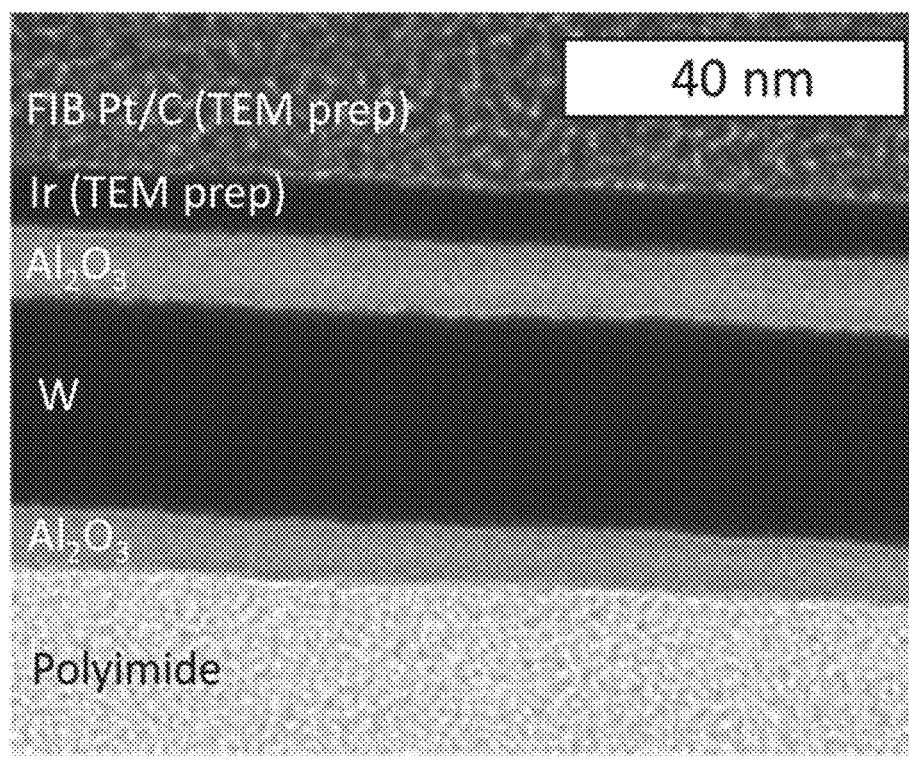

The present invention provides methods that allow for the interfacing of nanofabricated components with favorable adhesion and durability. In certain aspects, the methods of the invention allow for high density of contacting surface areas and mechanically interlinked components, thus providing strength for surface adhesion. In other aspects, the methods of the invention achieve great durability by employing high aspect ratio films, which can bend significantly before failure, and/or by using metallic materials, which have higher tensile strengths than silicon oxide. In yet other aspects, the methods of the invention allow for high density of connections and thus favorable data transfer among chips or other components. The methods of the invention may be used, for example, to create chips that have improved interconnects and/or are miniaturized as compared to the presently available chips.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

As used herein, the term "component" refers to any solid or semi-solid object, surface or material that is amenable to the introduction of suspended and/or freestanding structures on at least a portion of its surface. Non-limiting examples of components include chips, electronic components, wires, lenses, particulates, fabrics, tapes, sheets, optical waveguides, and the like. In certain embodiments, the component is rigid. A component that is "rigid" may be construed to mean that the component has a modulus of elasticity (Young's Modulus) of greater than about 50 gigapascals. In other embodiments, the component is flexible and/or bendable. A component that is "flexible" may be construed to mean that the component has a modulus of elasticity (Young's Modulus) of less than or equal to about 50 gigapascals, or which may be subjected to greater than 1% bending strain without failure.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition of the invention and/or using a method of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for implementation of the methods; or instructions for use of the compositions.

As used herein, the term "interfacing" refers to the creation of a physical and/or mechanical connection between two or more components. In certain embodiments, the interfacing is reversible. In other embodiments, the interfacing is not reversible.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

Disclosure

In certain aspects, the present invention relates to the use of suspended and/or freestanding nanoscale thickness membranes to achieve mechanical and electrical interfacing between surfaces of components. In certain embodiments, the membranes are fabricated using ALD. In other embodiments, the membranes comprise "2D nanomaterials", such as but not limited to graphene, tungsten disulfide, molybdenum disulfide, boron nitride, and the like.

In certain embodiments, suspended and/or freestanding structures are created on the surface of two or more components. The surfaces are then mated together (or contacted), and the structures interpenetrate to provide mechanical linkages between the surfaces of the two or more components. In other embodiments, electrical and/or thermal connections are enabled by the mechanical system of the invention. In yet other embodiments, the suspended and/or freestanding structures comprise electrically conducting materials such as tungsten. In yet other embodiments, once the methods of the invention form the required mechanical bond among the components, further processing such as ALD of insulating ceramics is used to cement and strengthen the bond, and isolate the interfaced parts from the surrounding environment.

Suspended and/or Freestanding Structures from ALD

Because ALD may be performed at low deposition temperatures and without high energy ion bombardment, fabrication by ALD on polymers avoids problems associated with other deposition techniques on polymers, and thereby enables a novel generation of devices. Inorganic ALD material generation on organic polymers is a reliable, scalable, and high-performing method utilizing aluminum oxide ($Al_2O_3$) as a model material. Other materials are available in conformal ALD because $Al_2O_3$ is often used as a seed layer for the growth of metal, semiconducting and insulating layers including, but not limited to W, Ru, Pt, ZnO, $TiO_2$ and $SiO_2$. Polymers may also be used as insulating layers, adhesion layers, thermal barrier layers, encapsulating biocompatible gels, moldable substrates, and flexible or stretchable substrates. ALD materials have uses as electrical, mechanical, or optical layers for patterned N/MEMS, and may offer advantageous coatings for gas diffusion applications and micro-system packaging.

Figure 5A:
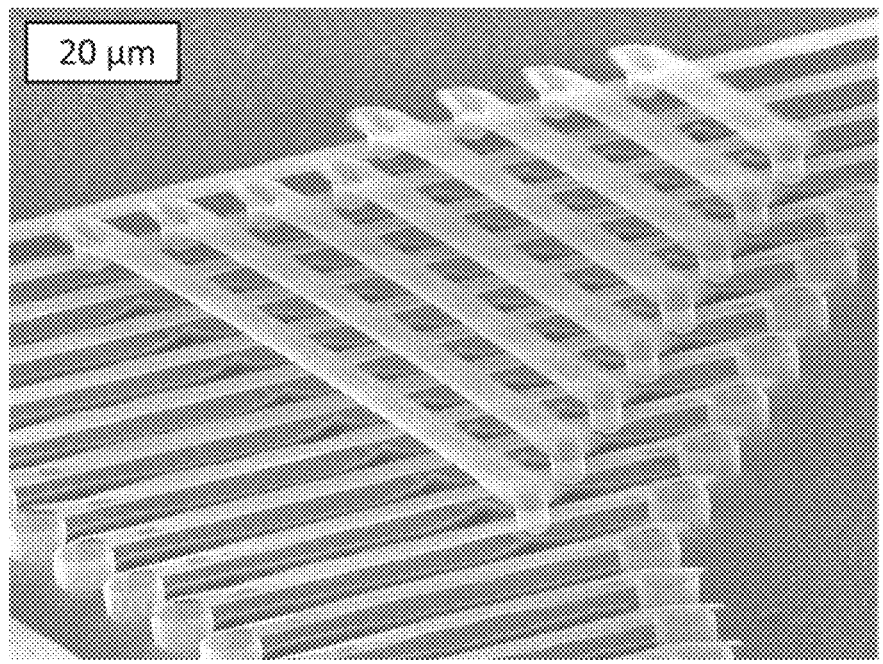
FIGS. 5A-5F illustrate SEM images of a variety of fully released microstructures fabricated using the process from FIG. 2A.

As illustrated in FIGS. 4A-4E, the process performs ALD on a polyimide mold with vias, trenches and exposed electrical connection layers. This laminate was demonstrated experimentally from a metal layer of W or Ru surrounded by two ALD $Al_2O_3$ layers. The bottom layer coated the polyimide and promoted nucleation of the metal layer, and the top layer protected against oxidation of the metal layer and/or balanced stress gradients to promote flatness in the final structure. Although $Al_2O_3$ was present between the ALD metal and the electrode, it was sufficiently thin that electrical connection was readily achieved through the $Al_2O_3$. With an extended fabrication process (FIG. 4A), two-level suspended structures with a 13.5 nm thickness laminate of $Al_2O_3/Ru/Al_2O_3$ were fabricated, as shown in FIG. 5A. By utilizing polymer sacrificial layers over traditional $SiO_2$ layers, smooth additive processing levels are easily spun on at thicknesses ranging from tens of nanometers to hundreds of microns. Additional device levels are built by spinning on additional polyimide layers over existing ALD patterns on underlying polyimide, a task not easily accomplished by traditional Si micromachining. These additional polyimide levels may be selectively processed without damaging the underlying ALD layers. The process is likely to be extensible to any number of levels as long as the final structure is designed to be mechanically robust and self-supporting. These ALD laminates produce very robust structures. For example, in FIG. 5A, the first level fixed-fixed cantilevers have length to thickness aspect ratios of $10^4$ and remain very flat, even while supporting multiple anchors from second level cantilevers.

Figure 5B:
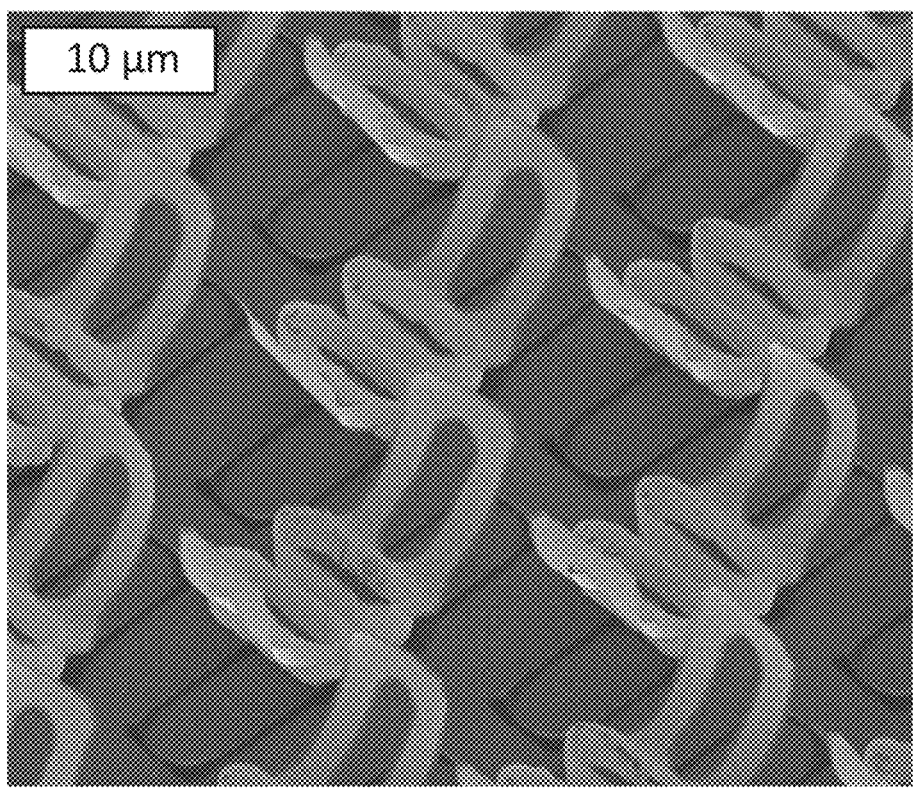
Figure 5C:
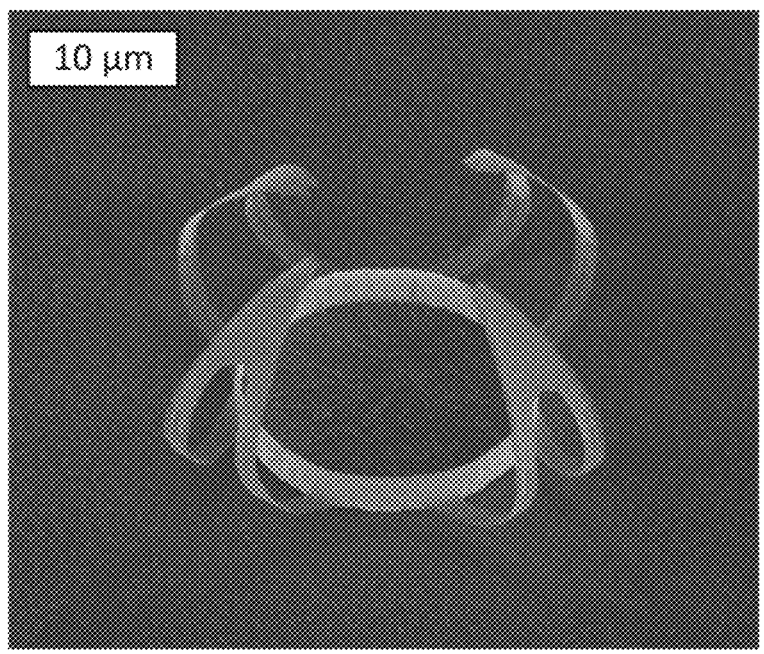
Figure 5D:
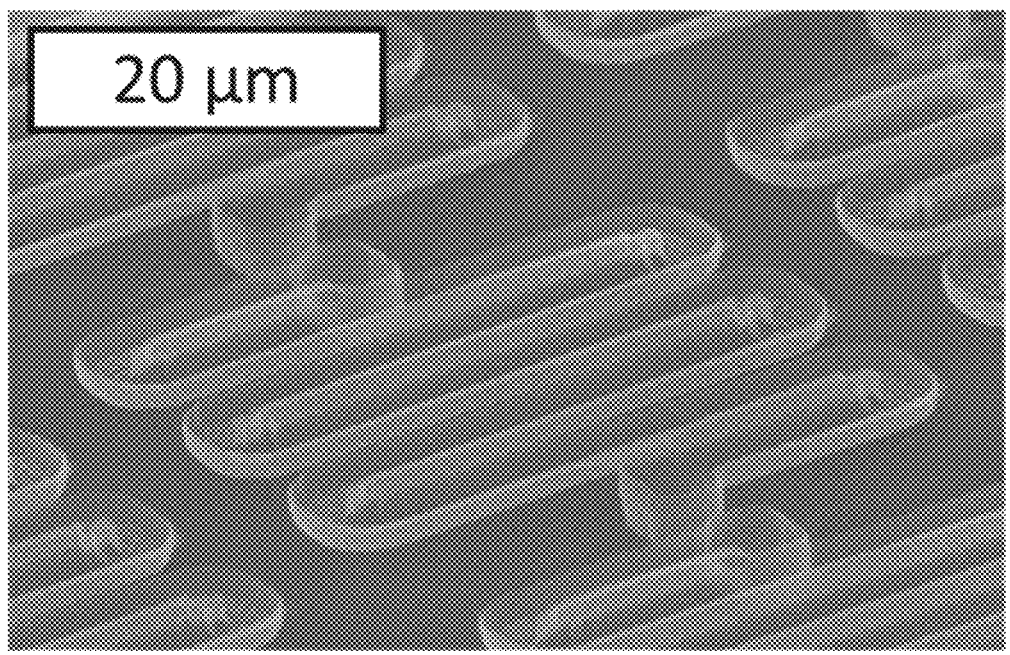
Figure 5E:
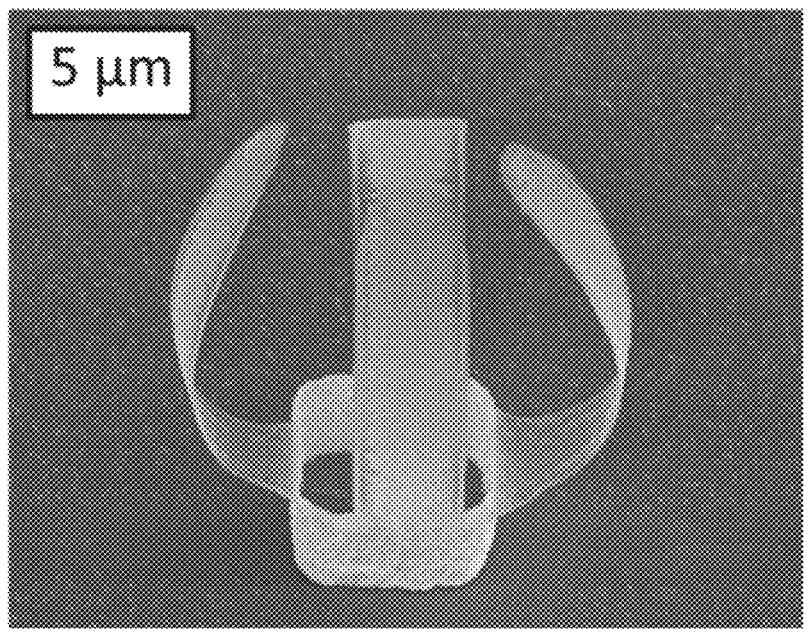
Figure 5F:
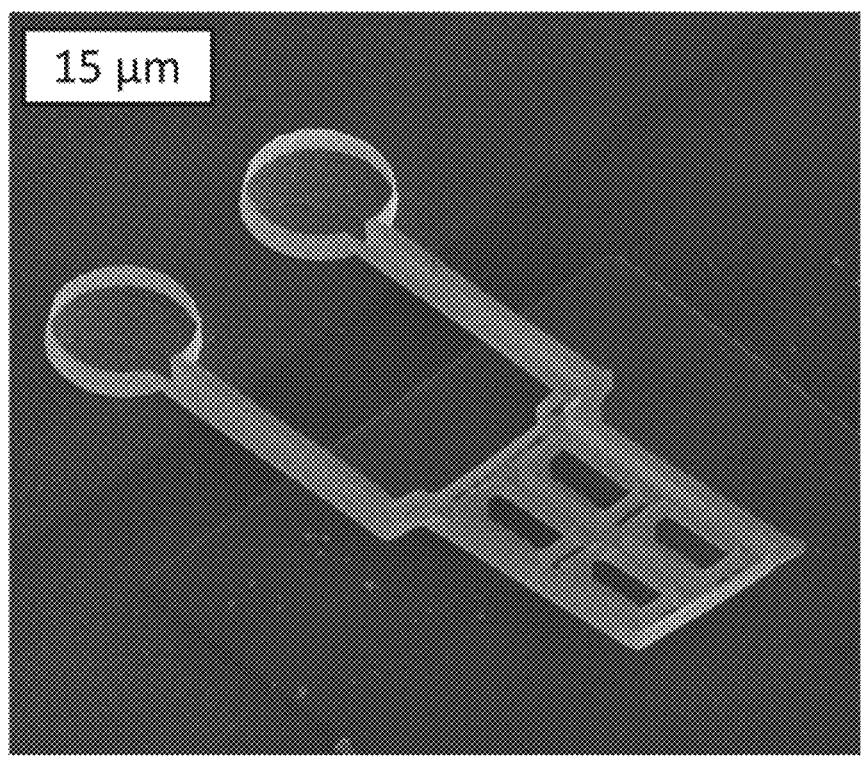

By utilizing standard lithography methods in the suspended and/or freestanding ALD process, batch fabrication of any pattern that can be achieved with micro or nanolithography is possible. A variety of patterns with suspended and/or freestanding ALD laminates with W and Ru surrounded by $Al_2O_3$ may be seen in FIGS. 5A-5F. FIG. 5B demonstrates an array of $Al_2O_3/W/Al_2O_3$ structures curled upwards, potentially useful for engineered 3-D metamaterials or interconnect contact springs. FIGS. 5C and 5E demonstrate flower petal patterns for potential applications such as nanotrapping systems for single cell biological testing platforms. Flat structures are also achievable through stress balancing (FIGS. 6A-6C) or additional mechanical reinforcement (FIGS. 5D and 5F).

N/MEMS devices continually face mechanical issues surrounding residual stress effects from both intrinsic film stress and fabrication conditions. To suspend flat or specifically curled structures, control over the properties of these active thin films is vital. Control of mechanical properties by incorporating a three-dimensional mold in the sacrificial polyimide layer is also feasible.

Figure 6A:
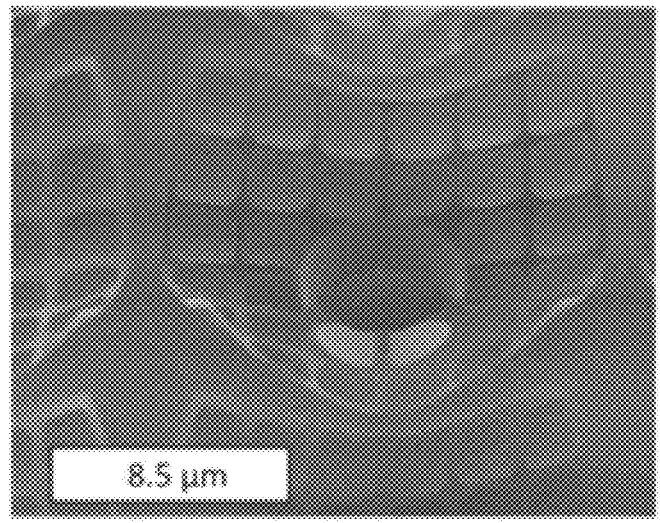
FIGS. 6A-6C illustrate processing control of curvature. SEM images of suspended membranes for microbolometer applications, with cross section of $Al_2O_3$ (blue) and W (yellow) (not to scale). Only the top $Al_2O_3$ layer was varied in thickness. Identical W and lower $Al_2O_3$ layers were used in all three images. Each square structure was 16 μm×16 μm.
Figure 6A:
Figure 6B:
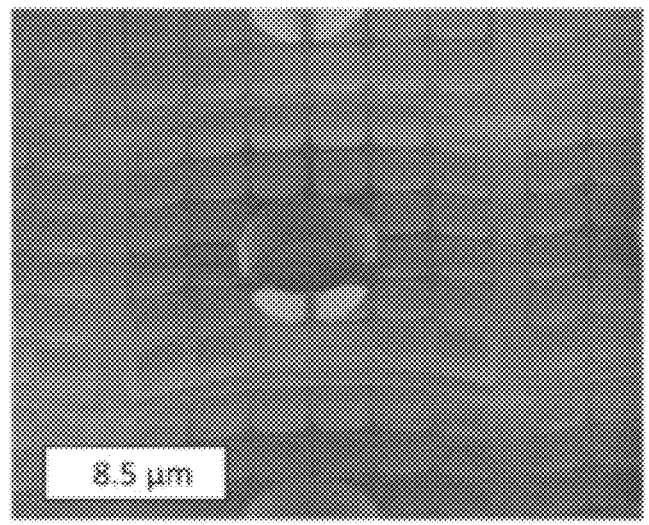
Figure 6B:
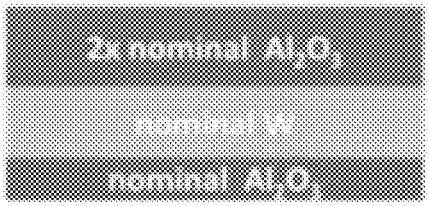
Figure 6C:
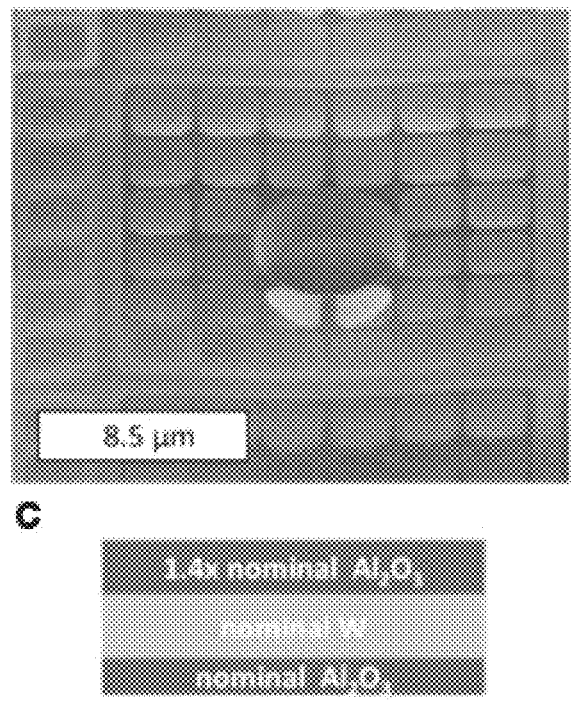
Figure 7:
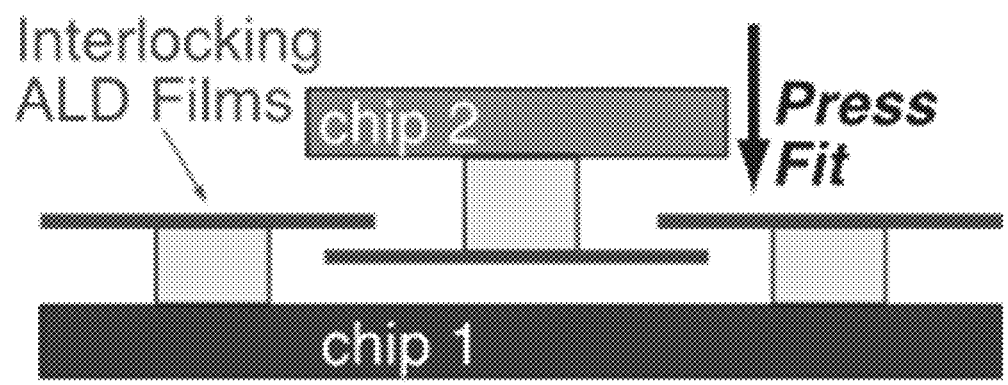
FIG. 7 is a schematic of a non-limiting representation of interfacing chips.

The devices illustrated in FIGS. 5A-5F and 6A-6C may be used in interconnect designs. In a non-limiting example, FIGS. 5B, 5C and 5E may be used as spring-like interconnects, but with a smaller pitch than currently available systems. FIGS. 6A-6C illustrates a design of flat structures that may be used within the methods of the present invention.

Interfacial Mechanical Bonding System

The present invention provides an interfacial mechanical bonding system that joins structures, including heterogeneous dies, through the use of 100-nm thickness (or thinner) suspended and/or freestanding structures fabricated using an atom-scale assembly process. The methods of the invention may be used in the interfacing of heterogeneous parts, such as but not limited to microchip interconnections.

In certain aspects, methods such as surface micromachining, lithography, and atomic layer deposition (ALD) are used to generate suspended and/or freestanding objects with nanoscale thicknesses and shapes determined by lithographic patterning and residual stresses in the ALD-generated films. The present methods may be used to fabricate novel snap-together interconnect technology with the potential for fabrication of nanoscale, solderless mechanical and electrical interconnects.

The present invention includes aspects such as top-down fabrication of submicron-scale interfacing components; implementation of suspended and/or freestanding ALD layers or 2D nanomaterials for interconnect technology; and press-fit interfaces as a viable alternative to soldering, brazing, and other thermal processing for assembly of electrical interconnects.

In certain embodiments, the methods of the invention may be used with suspended and/or freestanding structures with a pattern width (also referred to as resolution) and/or a device pitch (separation between individual devices or structures) that can each independently range from about 200 µm to about 5 nm.

The methods of the invention allow for miniaturization to nanoscale interconnection and use on flexible substrates. By use of fine scale patterning techniques such as electron beam lithography, deep ultraviolet lithography, or nanoimprint lithography, structures with nanoscale patterns can be achieved. Because the thickness of the suspended and/or freestanding layers is on the order of 1 to 1,000 atoms, the aspect ratio of thickness to length of suspended and/or freestanding membranes allows for generation of flexible structures at the submicron scale, which are capable of deforming sufficiently to allow intermeshing of structures from opposing surfaces.

The present invention allows for heterogeneous integration and interfacing of discrete devices from the microscale to the nanoscale, with applications across all ranges of engineering, from computation, to energy, biomedical engineering and sensors. The present invention further allows advancement of integration of heterogeneous chips and components in microscale and nanoscale systems, by providing a viable alternative to currently limited technologies for mechanical and electrical interfaces. The present invention is integrable with current CMOS electronics fabrication and other electronics fabrication lines. Furthermore, the invention provides a novel system for device manufacturing, advancing new devices and technologies at ever smaller size scales. This allows for continued increase in the density and diversity of electronic and electromechanical devices, minimization of the power consumption of devices and packaging as form factors are reduced, and further enablement of the long-awaited potential for top-down designed nanotechnology systems. In certain embodiments, the connection density ranges from 4,400/mm$^2$ (for a 15 µm device pitch) to $1.11 \times 10^8$/mm$^2$ (for a 30 nm pitch).

The specific application in small-scale interconnects presents societal benefits based on both mechanical and electrical functionality. Mechanically, development of a viable adhesion system based on microfabricated or nanofabricated structures allows better control than current efforts based on gecko biomimetics, and it allows elimination of thermal processing to achieve bonded parts. Because the bond is purely based on compliant mechanical systems, designs can accommodate differential thermal expansion across an interface. The nano-manufacturing process can be implemented on flexible substrates, and therefore is relevant to both current manufacturing and the upcoming diversification of device fabrication that is expected for electronics and electromechanical systems on flexible substrates.

The invention includes solderless microscale and nanoscale adhesion and data interfacing technologies, providing a viable alternative to currently limited technologies for mechanical and electrical interfaces, integrable with CMOS and other electronics fabrication lines. It does not require high temperature bonding steps, and is inert to atmospheric oxidation, resulting in simplified fabrication and elimination of solder and associated problems such as tin whiskers, tin pest, flux and oxidation control, inclusions and void management, thermal cycling failure, and thermal reflow processing.

Electrically, the interconnect system allows, in comparison to current solder or metallurgical systems, for an increase in the areal density of connections, increase in the rate of data transmission, decrease in the path length for data transmission across an interconnection, and decrease in the size required for electronic components and electronic packaging. The application to the manufacturing of electronics allows for simplified fabrication lines, improved competitiveness and range of product offerings, and elimination of solder and associated problems such as tin whickers, tin pest, flux and oxidation control, inclusions and void management, failure under thermal cycling, and thermal reflow processing in manufacture.

Because the interfacing bond is purely based on compliant mechanical systems, designs can accommodate differential thermal expansion across an interface. By allowing data interfacing using parts 10 µm or smaller, the interconnect system allows an increase in the areal density of connections, an increase in the rate of data transmission, a decrease in the path length for data transmission, and a decrease in the size required for electronic components and packaging. Thus allows for increased density and diversity of electronic and electromechanical devices, and minimization of power consumption in devices and packaging.

In certain aspects, improvements in electronics reliability, speed, power consumption, and system size are the major initial impact on defense technologies. This technology also has a much broader impact through heterogeneous chip integration. The technology enables custom construction of small runs of electronic systems incorporating various devices and processing electronics that can be manufactured as "off-the-shelf" parts and later integrated in one system assembled as a stack of different chips. In such a stack, each component can be upgraded without requiring a complete redesign, for instance an infrared camera with improved sensitivity, or a battery with improved capacity.

In certain aspects, the invention achieves one of the long-term visions for nanotechnology: top-down fabrication of solid objects limited only by the resolution of lithography. Devices with 5 or 10-nm pattern resolution (or width) are possible as part of the present invention. By generating a toolkit for advanced fabrication, the invention generates opportunities for additional applications, such as sensors or electromagnetic metamaterials that act on visible light.

This invention advances the capabilities of atomic layer deposition or ALD, nanosystem development, and microscale and nanoscale interfacing. Due to the nanoscale thicknesses of all the devices fabricated, this invention may enable experimental systems that may provide data to test models for physics of electron and phonon transport and load transfer between small-scale structures. This invention may result in better understanding of the capabilities and robustness of patterned nano-thickness structures and the mechanics of ultrathin films; new and better studies of the mechanisms of load, phonon, and electron transfer between nanostructured heterogeneous parts; and the effect of scaling these behaviors into larger systems. In turn, this knowledge enables development of new technologies using these phenomena.

Compositions

The invention provides interlocked components prepared according to any of the methods described herein.

The invention further provides a component, wherein at least a portion of the surface of the component comprise suspended and/or freestanding structures, wherein the pattern width or device pitch of the suspended and/or freestanding structures is equal to or lower than about 1 mm, wherein the suspended and/or freestanding structures are prepared using a method comprising surface micromachining, lithography and/or atomic layer deposition (ALD).

In certain embodiments, the structures are supported on a sacrificial material layer. In other embodiments, the structures are anchored to a substrate immobilized on the component. In yet other embodiments, ALD is used to deposit a conductive layer on the suspended and/or freestanding structures. In yet other embodiments, the conductive layer comprises tungsten or ruthenium. In yet other embodiments, the conductive layer is coated with an insulating layer. In yet other embodiments, the insulating layer comprises $Al_2O_3$ or $TiO_2$. In yet other embodiments, the suspended and/or freestanding structures comprises a 2D nanomaterial. In yet other embodiments, the 2D nanomaterial comprises graphene, tungsten disulfide, molybdenum disulfide, or boron nitride. In yet other embodiments, the average pattern width and/or device pitch of the suspended and/or freestanding structures is equal to or less than about 200 µm. In yet other embodiments, the average pattern width and/or device pitch of the suspended and/or freestanding structures is selected from the group consisting of equal to or less than about 50 µm, equal to or less than about 20 µm, equal to or less than about 10 µm, equal to or less than about 1 µm, equal to or less than 100 nm, equal to or less than 50 nm, equal to or less than 20 nm, and equal to or less than about 5 nm. In yet other embodiments, the average thickness of the suspended and/or freestanding structures ranges from about 1 to about 1,000 atoms. In yet other embodiments, the average thickness of the suspended and/or freestanding structures is equal to or less than about 100 nm. In yet other embodiments, the average thickness of the suspended and/or freestanding structures is equal to or less than about 20 nm. In yet other embodiments, the component is rigid, flexible or malleable. In yet other embodiments, an electrical contact exists between the suspended and/or freestanding structures and the corresponding supporting layer in the component. The component of claim 20, wherein the conductive layer comprises platinum, molybdenum, titanium nitride, zinc oxide, tin oxide, or any other conducting or semiconducting material generated from atomic layer deposition. In yet other embodiments, the insulating layer comprises $SiO_2$, $HfO_2$, or any other insulating material generated from atomic layer deposition. In yet other embodiments, the sacrificial material layer comprises a polymer, a metal, a semiconductor, or a ceramic. In yet other embodiments, the sacrificial material layer comprises at least one selected from the group consisting of polyimide, cellulose, epoxy, SU-8 epoxy, nickel, copper, silver, tin, silicon, and silicon oxide, and any alloy thereof. In yet other embodiments, the sacrificial material layer comprises a polymer generated using molecular layer deposition, wherein the polymer optionally comprises poly (aluminum alkoxide). In yet other embodiments, the surface micromachining method includes evaporation, sputtering, or chemical vapor deposition of a material. In yet other embodiments, the material includes at least one selected from the group consisting of gold, nickel, titanium, carbon, nickel, chromium, boron nitride, aluminum, copper, silicon, and germanium. In yet other embodiments, the component is optically transparent. In yet other embodiments, the component is optically translucent.

Methods

The invention provides a method of promoting interfacing between two or more components, the method comprising contacting the two or more components, wherein at least a portion of the contacted surfaces of the two or more components independently comprise suspended and/or freestanding structures, wherein the pattern width or device pitch of the suspended structures is equal to or lower than about 1 mm, whereby interlocking of structures of the two or more components takes place.

In certain embodiments, the suspended and/or freestanding structures in the two or more components are the same. In other embodiments, the suspended and/or freestanding structures in the two or more components are not the same. In yet other embodiments, the suspended and/or freestanding structures in the two or more components are complementary to each other. In yet other embodiments, the average pattern width and/or device pitch of the suspended and/or freestanding structures is equal to or less than about 200 µm. In yet other embodiments, the average pattern width and/or device pitch of the suspended and/or freestanding structures is selected from the group consisting of equal to or less than about 50 µm, equal to or less than 20 µm, equal to or less than about 10 µm, equal to or less than about 1 µm, equal to or less than 100 nm, equal to or less than 50 nm, equal to or less than 20 nm, and equal to or less than 5 nm. In yet other embodiments, the average thickness of the suspended and/or freestanding structures ranges from about 1 to about 1,000 atoms. In yet other embodiments, the average thickness of the suspended and/or freestanding structures is equal to or less than about 100 nm. In yet other embodiments, the average thickness of the suspended and/or freestanding structures is equal to or less than about 20 nm. In yet other embodiments, the interlocking of the two or more components creates an electrical connection among the components. In yet other embodiments, the interlocking of the two or more components creates a thermal connection among the components. In yet other embodiments, the suspended and/or freestanding structures are prepared using a method comprising surface micromachining, lithography and/or atomic layer deposition (ALD). In yet other embodiments, the interlocked two or more components are further submitted to the ALD of an insulating ceramic. In yet other embodiments, at least one of the components is rigid, flexible or malleable. In yet other embodiments, an electrical contact exists between the suspended and/or freestanding structures and the corresponding supporting layer in at least one of the components.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. Although the description herein contains many embodiments, these should not be construed as limiting the scope of the invention but as merely providing illustrations of some of the presently preferred embodiments of the invention.

In yet other embodiments, the insulating ceramic includes at least one selected from the group consisting of $Al_2O_3$, $TiO_2$, $SiO_2$, and $HfO_2$. In yet other embodiments, the interlocked two or more components are further subjected to atomic layer deposition of a conducting or semiconducting material. In yet other embodiments, the conducting or semiconducting material includes at least one selected from the group consisting of tungsten, ruthenium, platinum, molybdenum, titanium nitride, zinc oxide, and tin oxide. In yet other embodiments, at least one of the components is optically transparent. In yet other embodiments, at least one of the components is optically translucent. In yet other embodiments, at least one of the components is electrically conductive. In yet other embodiments, the electrical conductivity of at least one component is greater than $10^5$ sieverts per meter.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Example

In non-limiting examples, films approximately 20 nm in thickness were suspended on polymer pillars. Surface bonding was achieved from interfacing of two complementary surfaces. Bonding was achieved with two distinct design patterns, with pattern width on the order of 10-20 μm. Such widths are already near the lower limits of what can be reliably achieved with solder processing.

Batch fabrication of any pattern that can be achieved with micro or nanolithography is possible (FIGS. 3A-3E).

It should be noted that the use of polymer pillars within the invention is not required. Suspended structures may also be generated by making through-holes through a sacrificial material layer such as a polymer. In that case, ALD and/or other materials deposition generate anchoring structures that connect the suspended membranes directly to the underlying substrate. In this case, complete removal of the sacrificial material layer still results in fabrication of the suspended membranes. An example demonstrating such fabrication is shown in FIGS. 6A-6C. Electrical connection can be achieved by anchoring the SA films to conducting substrates.

Results and overviews of two designs are shown in FIGS. 2A-2E and 3A-3E.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of promoting interfacing between two or more components, the method comprising:
    contacting a first surface from a first component and a second surface from a second component,
    wherein at least a first portion of the first contacted surface and a second portion of the second contacted surface independently comprise at least one selected from the group consisting of suspended structures and freestanding structures, and
    wherein the pattern width or device pitch of the at least one selected from the group consisting of suspended structures and freestanding structures is equal to or lower than about 1 mm; and
    interlocking, without thermal processing, the first component and the second component via the first portion of the first contacted surface and the second portion of the second contacted surface interpenetrating.

2. The method of claim 1, wherein the average pattern width or device pitch of the at least one selected from the group consisting of suspended structures and freestanding structures is equal to or less than about 200 μm.

3. The method of claim 1, wherein the average thickness of the at least one selected from the group consisting of suspended structures and freestanding structures ranges from about 1 to about 1,000 atoms.

4. The method of claim 1, wherein the interlocking of the two components creates among the components at least one selected from the group consisting of an electrical connection and a thermal connection.

5. The method of claim 1, wherein the at least one selected from the group consisting of suspended structures and freestanding structures is prepared using a method comprising at least one selected from the group consisting of surface micromachining, lithography, and ALD.

6. The method of claim 1, wherein the interlocked two components are further subjected to ALD of an insulating ceramic.

7. The method of claim 1, wherein at least one of the components is rigid, flexible, or malleable.

8. The method of claim 1, wherein an electrical contact exists between the at least one selected from the group consisting of suspended structures and freestanding structures and a corresponding supporting layer in at least one of the components.

9. The method of claim 1, wherein at least one of the components is optically transparent or optically translucent.

* * * * *